(12) United States Patent
Wu et al.

(10) Patent No.: US 11,670,492 B2
(45) Date of Patent: Jun. 6, 2023

(54) CHAMBER CONFIGURATIONS AND PROCESSES FOR PARTICLE CONTROL

(71) Applicant: Applied Materials, Inc., Santa Clara, CA (US)

(72) Inventors: Fei Wu, Sunnyvale, CA (US); Abdul Aziz Khaja, San Jose, CA (US); Sungwon Ha, Palo Alto, CA (US); Ganesh Balasubramanian, Fremont, CA (US); Vinay Prabhakar, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 287 days.

(21) Appl. No.: 17/071,506

(22) Filed: Oct. 15, 2020

(65) Prior Publication Data
US 2022/0122823 A1   Apr. 21, 2022

(51) Int. Cl.
*H01J 37/32* (2006.01)

(52) U.S. Cl.
CPC .. *H01J 37/32871* (2013.01); *H01J 37/32862* (2013.01); *H01J 2237/335* (2013.01)

(58) Field of Classification Search
CPC ........... H01J 37/32871; H01J 37/32862; H01J 2237/335
See application file for complete search history.

(56) References Cited

U.S. PATENT DOCUMENTS

| | | | |
|---|---|---|---|
| 6,274,058 B1 * | 8/2001 | Rajagopalan | C23C 16/52 216/69 |
| 6,398,929 B1 * | 6/2002 | Chiang | H01L 21/76865 257/E21.585 |
| 7,468,326 B2 | 12/2008 | Chen et al. | |
| 2003/0051665 A1 | 3/2003 | Zhao et al. | |
| 2016/0314958 A1 | 10/2016 | Takiguchi et al. | |
| 2018/0025900 A1 | 1/2018 | Park et al. | |
| 2018/0345330 A1 | 12/2018 | Zhai et al. | |
| 2019/0311883 A1 | 10/2019 | Samir et al. | |

FOREIGN PATENT DOCUMENTS

| | | |
|---|---|---|
| CN | 109690730 A | 4/2019 |
| JP | H09-298181 A | 11/1997 |
| WO | 2012-093983 A2 | 7/2012 |

OTHER PUBLICATIONS

International Search Report and Written Opinion dated Feb. 4, 2022 in International Patent Application No. PCT/US2021/054377, 8 pages.

* cited by examiner

*Primary Examiner* — Erin F Bergner
(74) *Attorney, Agent, or Firm* — Kilpatrick Townsend & Stockton LLP (57) ABSTRACT

Exemplary processing methods may include forming a plasma of a cleaning precursor in a remote region of a semiconductor processing chamber. The methods may include flowing plasma effluents of the cleaning precursor into a processing region of the semiconductor processing chamber. The methods may include contacting a substrate support with the plasma effluents for a first period of time. The methods may include lowering the substrate support from a first position to a second position while continuing to flow plasma effluents of the cleaning precursor. The methods may include cleaning the processing region of the semiconductor processing chamber for a second period of time.

17 Claims, 4 Drawing Sheets

CHAMBER CONFIGURATIONS AND PROCESSES FOR PARTICLE CONTROL

TECHNICAL FIELD

The present technology relates to components and apparatuses for semiconductor manufacturing. More specifically, the present technology relates to processes for producing material films for semiconductor processing.

BACKGROUND

Integrated circuits are made possible by processes which produce intricately patterned material layers on substrate surfaces. Producing patterned material on a substrate requires controlled methods for forming and removing material. Some processes utilize plasma-enhanced precursors to facilitate deposition or removal operations. During development or removal of materials on a substrate, particles may be generated that may be removed or exhausted from the chamber. Depending on the flow paths created within the processing chamber, these particles may re-deposit on surfaces within the semiconductor processing chamber and cause buildup that can lead to arcing as well as issues with particles falling back onto the substrate. Although cleaning operations may be performed after substrate processing, these cleaning processes may incompletely clean surfaces and recesses of the chamber.

Thus, there is a need for improved systems and methods that can be used to produce high quality devices and structures. These and other needs are addressed by the present technology.

SUMMARY

Exemplary processing methods may include forming a plasma of a cleaning precursor in a remote region of a semiconductor processing chamber. The methods may include flowing plasma effluents of the cleaning precursor into a processing region of the semiconductor processing chamber. The methods may include contacting a substrate support with the plasma effluents for a first period of time. The methods may include lowering the substrate support from a first position to a second position while continuing to flow plasma effluents of the cleaning precursor. The methods may include cleaning the processing region of the semiconductor processing chamber for a second period of time.

In some embodiments, the cleaning precursor may be or include a halogen-containing precursor. The second period of time may be longer than the first period of time. At the first position the substrate support may be a distance from a faceplate of less than or about 20 mm. At the second position the substrate support may be a distance from a faceplate of greater than or about 30 mm. A plasma power may be maintained at greater than or about 1000 W to generate plasma effluents of the cleaning precursor. The processing region may be defined by a faceplate and the substrate support. The processing region may be further defined by an inner isolator extending radially about the processing region. The inner isolator may be seated on a ledge defined by an outer isolator. The outer isolator may be seated on a conductive ring. The conductive ring may be seated on a body of the semiconductor processing chamber. A liner may extend along the body of the semiconductor processing chamber towards the inner isolator and the conductive ring. A gap of greater than or about 20 mils may be maintained between the inner isolator and the conductive ring proximate a surface of the conductive ring seated on the body of the semiconductor processing chamber.

Some embodiments of the present technology may encompass semiconductor processing methods. The methods may include flowing plasma effluents of a cleaning precursor into a processing region of a semiconductor processing chamber. The methods may include contacting a substrate support with the plasma effluents for a first period of time. The methods may include lowering the substrate support from a first position to a second position while continuing to flow plasma effluents of the cleaning precursor. The methods may include cleaning the processing region of the semiconductor processing chamber for a second period of time at least 20% longer than the first period of time.

In some embodiments, a plasma power may be maintained at greater than or about 1000 W to generate plasma effluents of the cleaning precursor. The first period of time may be less than or about 40% of a total cleaning time. At the first position the substrate support may be a distance from a faceplate of less than or about 20 mm, and at the second position the substrate support may be a distance from a faceplate of greater than or about 30 mm. The semiconductor processing chamber may include an inner isolator extending radially about the processing region of the semiconductor processing chamber. The semiconductor processing chamber may include an outer isolator defining a recessed ledge on which the inner isolator is seated. The semiconductor processing chamber may include a body of the semiconductor processing chamber. The semiconductor processing chamber may include a conductive ring seated on the body of the semiconductor processing chamber. In some embodiments, a gap of greater than or about 50 mils may be maintained between the inner isolator and the conductive ring proximate a surface of the conductive ring seated on the body of the semiconductor processing chamber. The methods may include flowing the plasma effluents of the cleaning precursor into the gap during the second period of time.

Such technology may provide numerous benefits over conventional systems and techniques. For example, embodiments of the present technology may utilize chamber components that may increase available flow paths for cleaning precursors. Additionally, cleaning operations may be performed to further flow cleaning effluents into recesses within the chamber in which re-deposition or particle accumulation may occur. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, the chamber component integration may produce additional recesses or flow paths within the processing chamber.

As device features reduce in size, particle control on produced films may become more important. Cleaning operations may be performed to remove residual particles and maintain an environment to limit process drift and ensure uniform conditions between substrates. Although cleaning processes may produce adequate results along a flow path from a region in which the cleaning materials are delivered, in many processing chambers particle buildup may occur in additional regions. For example, the way in which components are positioned within the processing chamber may impact gaps and accesses in which particle deposition may occur. Cleaning materials may not adequately clean these regions, and buildup may occur. This buildup may lead to fall-on particles on subsequent substrates, or may create conductive paths that can lead to arcing within the processing chamber. Conventional technologies may be forced to perform more regular teardown operations to ensure component surfaces are clean.

The present technology overcomes these challenges by configuring chamber components to provide additional access for cleaning effluents within the processing region. Additionally, the present technology may perform cleaning operations that may ensure cleaning effluents are delivered into accesses within the chamber in which buildup may occur.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may be used to perform methods according to embodiments of the present technology before additional variations and adjustments to this system according to embodiments of the present technology are described.

Figure 1:
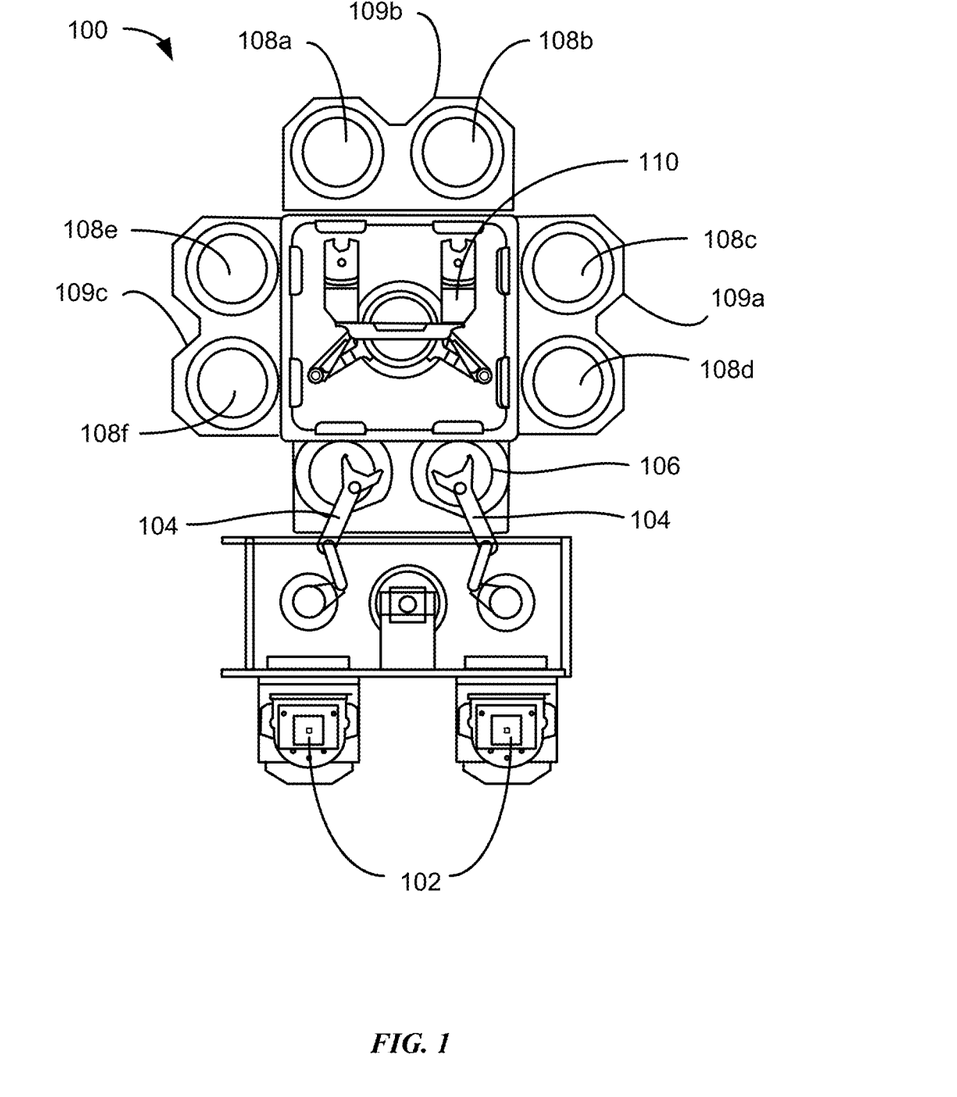
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of hardmasks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
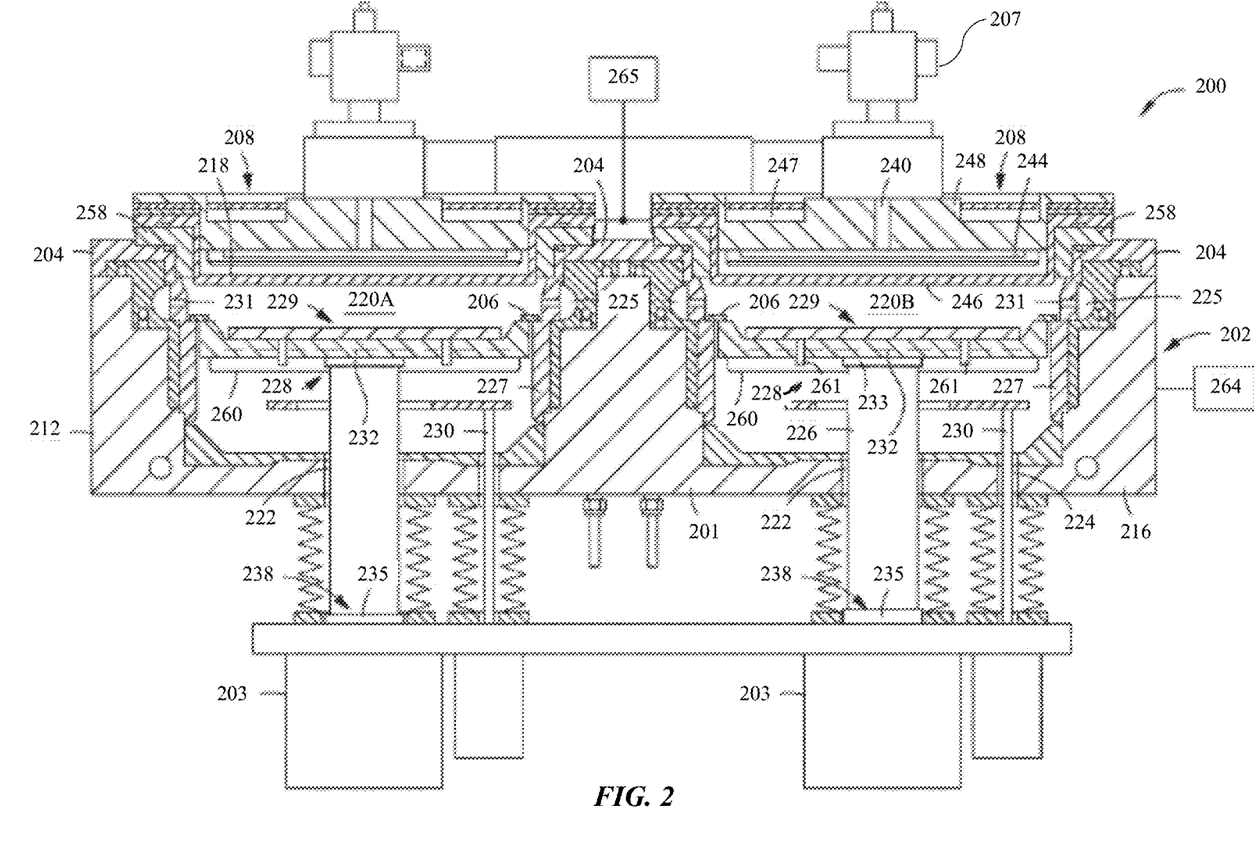
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. Cleaning precursors may be delivered to a remote plasma system unit 207, which may deliver plasma effluents into the processing chamber and processing regions to perform cleaning operations. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
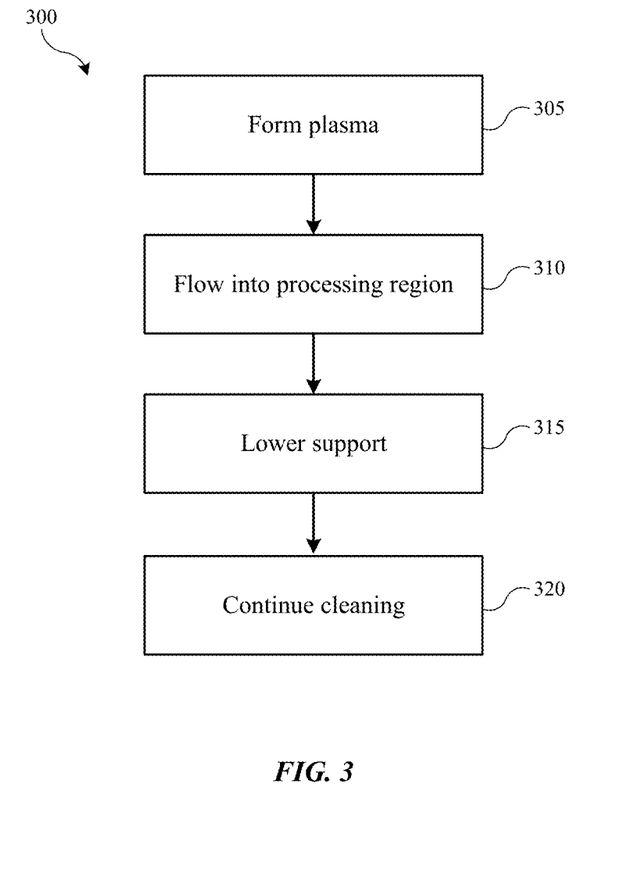
FIG. 3 shows exemplary operations in a semiconductor processing method according to some embodiments of the present technology.

Although the remaining disclosure will discuss hardmask processes, it is to be understood that the present technology may be applied to any number of processing operations including formation and removal processes occurring during fabrication. FIG. 3 shows exemplary operations in a semiconductor processing method 300 according to some embodiments of the present technology. The method may be performed in a variety of processing chambers, including processing system 200 described above. Method 300 may include a number of optional operations, which may or may not be specifically associated with some embodiments of methods according to the present technology. For example, many of the operations are described in order to provide a broader scope of the technology, but are not critical to the technology, or may be performed by alternative methodology as would be readily appreciated.

Method 300 may include additional operations prior to initiation of the listed operations. For example, additional processing operations may include forming structures on a semiconductor substrate, which may include both forming and removing material. Prior processing operations may be performed in the chamber in which method 300 may be performed, or processing may be performed in one or more other processing chambers prior to delivering the substrate into the semiconductor processing chamber in which method 300 may be performed. Regardless, method 300 may optionally include delivering a semiconductor substrate to a processing region of a semiconductor processing chamber, such as processing system 200 described above, or other chambers that may include components as described above. The substrate may be deposited on a substrate support, which may be a pedestal such as pedestal 228, and which may reside in a processing region of the chamber, such as processing region 220 described above.

The substrate may be any number of materials on which materials may be deposited. The substrate may be or include silicon, germanium, dielectric materials including silicon oxide or silicon nitride, metal materials, or any number of combinations of these materials, which may be the substrate, or materials formed on the substrate. In some embodiments a deposition may be performed in which one or more materials may be deposited on the substrate. For example, in some embodiments a hardmask may be formed overlying one or more materials on the substrate, or over the base substrate. The mask material may be a carbon-containing material, a silicon-containing material, or any number of other materials used in semiconductor processing.

During the deposition, although materials may be formed or deposited on the substrate, particles may be generated during the process, or may not deposit on the substrate and may be flowed from the substrate. Although a majority of these particles may be exhausted from the processing chamber, particles may flow into gaps between chamber components, or simply contact and re-deposit on exposed surfaces of the chamber, which may be at lower temperatures that may facilitate re-deposition, for example. Subsequent the process, the substrate may be removed from the chamber. A cleaning operation may then be performed to remove residual particles within the processing region.

During semiconductor processing, the substrate may be raised to a processing position adjacent a faceplate or diffuser as discussed above. An exhaust system, including a pumping liner, may remove unreacted materials and particles from a location below the substrate being processed. This may allow particles to re-deposit in locations beneath the substrate support in an operational position, such as on isolators, liners, or other components about the chamber body. Gaps between these components may allow particle flow, which may create buildup as discussed above. Because many cleaning operations are performed with substrate supports at or near an operational position, flow of the cleaning materials into these other regions may be limited. Additionally, because it may take an amount of time for cleaning effluents to penetrate into recesses within the chamber, the cleaning operation may be halted before locations that are harder to access may be fully cleaned.

Conventional technologies may seek to limit intrusion of particles by reducing gap sizes between components of the semiconductor processing chamber. However, although reducing gap sizes may lower an amount of particle intrusion, buildup may still occur over time. These reduced gaps may also reduce the ability of cleaning materials to access these regions, which may further challenge removal. The present technology may adjust cleaning processes to facilitate particle removal, and may also modify chamber component configurations to increase access within these regions. Increasing gap sizes may seem counterintuitive, as increasing gap sizes may more readily allow particle buildup and intrusion. Some chamber configurations may indeed increase particle access into gaps formed, which may cause re-deposition or buildup during each processing cycle. However, the increased gaps may also facilitate cleaning material access, which may more readily remove the buildup within the gap, and more effectively clean locations within the processing region. By also adjusting a cleaning process in method 300 to improve flow within these regions, cleaning may be improved despite the additional buildup caused.

After a substrate has been removed from a processing region of the chamber, the substrate support may be raised back to or towards an operational position within the processing chamber, such as proximate a faceplate within the processing chamber. A plasma may be formed at operation 305 from one or more cleaning precursors. The cleaning precursors may include halogen-containing precursors, oxygen-containing precursors, or hydrogen-containing precursors, among any other materials that may be used in semiconductor cleaning operations. The precursors may be flowed into the processing chamber, or may be flowed into a remote plasma source as previously described, which may generate plasma effluents of the precursors. The precursors may be flowed into the processing region of the semiconductor processing chamber at operation 310, where the effluents may interact with chamber components to remove particles and other reaction or deposition products.

The cleaning effluents may interact with any number of chamber components while flowing through the processing chamber, and may flow to remove deposition byproducts from a faceplate that may at least partially define the processing region with the substrate support. The effluents may also contact the substrate support in the first position near the faceplate. By having the substrate support in a raised position, increased interaction may occur between the effluents and surfaces of the substrate support, which may ensure sufficient removal on surfaces of the substrate support, where deposition was targeted during processing. The contacting may occur for a first period of time during which removal may be performed. Subsequent the first period of time, and while effluents may still be flowed into the processing region, the substrate support may be lowered from the first position to a second position at operation 315.

By lowering the substrate support, the cleaning precursors or plasma effluents may more readily access further into the processing region. This may allow the cleaning precursors to flow into gaps between chamber components, and increase removal from additional locations within the processing chamber. The cleaning may be continued during operation 320 for a second period of time with the substrate support in the lowered second position. After the additional cleaning time, the cleaning may be halted, and a subsequent substrate may be delivered for processing, or other operations such as seasoning may be performed.

The cleaning operation may include a first period of time at a higher substrate support position, and a second period of time at a lower substrate support position, which may produce a total cleaning time for the method 300. In some embodiments, the plasma cleaning may be performed with the first period of time being shorter than the second period of time. This may increase time for accessing lower regions within the processing volume, while still allowing interaction with the substrate support. Accordingly, in some embodiments the first period of time may be less than or about 50% of the total cleaning time, and may be less than or about 45% of the total cleaning time, less than or about 40% of the total cleaning time, less than or about 35% of the total cleaning time, less than or about 30% of the total cleaning time, less than or about 25% of the total cleaning time, less than or about 20% of the total cleaning time, less than or about 15% of the total cleaning time, less than or about 10% of the total cleaning time, or less. Additionally, the second period of time may be greater than or about 50% of the total cleaning time, and may be greater than or about 55% of the total cleaning time, greater than or about 60% of the total cleaning time, greater than or about 65% of the total cleaning time, greater than or about 70% of the total cleaning time, greater than or about 75% of the total cleaning time, greater than or about 80% of the total cleaning time, greater than or about 85% of the total cleaning time, greater than or about 90% of the total cleaning time, or more.

Because the substrate support may be positioned in the second position for a longer period of time, this may reduce an amount of interaction with cleaning materials in embodiments of the present technology. In order to increase removal during cleaning operations at greater distances, and limit recombination during cleaning, in some embodiments a plasma power used to generate the plasma effluents may be maintained at greater than or about 1000 W, and may be maintained at greater than or about 2000 W, greater than or about 2500 W, greater than or about 2750 W, greater than or about 3000 W, greater than or about 3200 W, greater than or about 3400 W, greater than or about 3600 W, greater than or about 3800 W, or higher.

During the first period of time, the substrate support may be positioned proximate the faceplate within the processing region of the semiconductor processing chamber. In some embodiments, a distance between the substrate support and the faceplate during the first period of time may be less than or about 25 mm, and may be maintained at less than or about 22 mm, less than or about 20 mm, less than or about 18 mm, less than or about 16 mm, less than or about 14 mm, less than or about 12 mm, less than or about 10 mm, or less. The substrate support may then be lowered to the second position while the plasma effluents are still being flowed, and then maintained at a second position during the second period of time. During the second period of time, the substrate support may be maintained a distance from the faceplate of greater than or about 25 mm, and may be maintained a distance from the faceplate of greater than or about 30 mm, greater than or about 32 mm, greater than or about 34 mm, greater than or about 36 mm, greater than or about 38 mm, greater than or about 40 mm, or more, which may provide additional access to other components at least partially defining the processing region.

Figure 4:
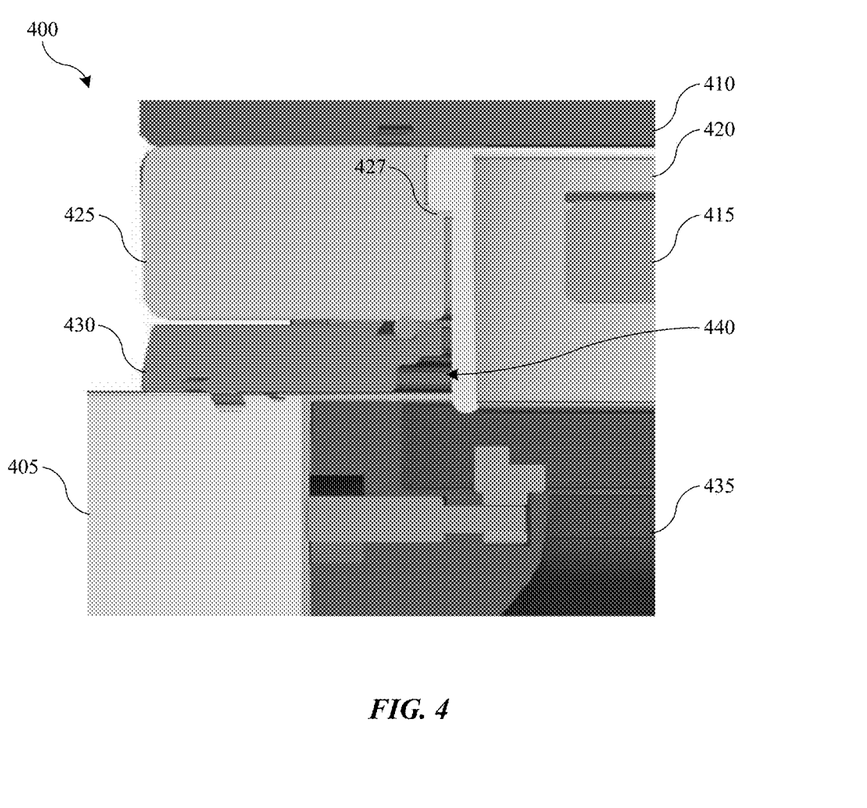
FIG. 4 shows a partial schematic cross-sectional view of chamber components according to some embodiments of the present technology.

As explained above, the chamber configuration may also be adjusted to increase gap spacing, which may counterintuitively increase particle access and re-deposition within the processing chamber. However, the configuration may also improve access for cleaning precursors during performance of method 300, where a substrate support may be maintained at a second position that may afford increased access to the chamber components. FIG. 4 shows a partial schematic cross-sectional view of chamber components of an exemplary processing chamber 400 according to some embodiments of the present technology. It is to be understood that any of the features, components, or characteristics of chamber 200 may also be included in chamber 400, and chamber 400 may illustrate additional details of aspects of chamber 200 described above.

As illustrated, chamber 400 may include a chamber body 405. A faceplate 410 may be included that at least partially defines a processing region from above. A substrate support 415 may be included, and may be illustrated in a first position, such as proximate the faceplate as previously described. A inner isolator 420 may be included extending radially about the processing region, and at least partially defining the processing region with the faceplate and substrate support. The chamber may also include an outer isolator 425, which may define a recessed ledge 427 on which inner isolator 420 may be seated. Between the chamber body 405 and the outer isolator 425 may be a conductive ring 430, which may extend about the processing chamber and be seated directly on the chamber body 405. Additionally, a liner 435 may extend up an interior surface of the chamber body towards the inner isolator and the conductive ring as shown.

Many conventional systems may also include an additional isolator seated on the liner and extending past a lower surface on an exterior side, such as behind, the inner isolator. The purpose of such an additional isolator may be to limit access to the components behind the inner isolator by forming a choke. However, materials may still enter and build up within these regions. Conventional technologies may seek to limit this gap size to further limit access. Despite a limited access, particle accumulation may still occur over time, which may lead to extended down time for cleaning, if not damage from the buildup as discussed above. Moreover, while particles may still access and build up within the region, cleaning precursors or effluents may be further limited from entering within the region, which may frustrate removal of the buildup.

As illustrated, the present technology may increase a gap, which may ensure particle buildup occurs. However, by maintaining a large enough gap, and by performing cleaning operations as previously described, effluents of cleaning precursors may also readily access the gap region. Hence, chamber configurations according to embodiments of the present technology may actually increase deposition or buildup within or along these components, such as a backside of the inner isolator as well as on the conductive ring. However, because cleaning materials may easily access these regions, any buildup during processing operations may be substantially or completely removed during cleaning operations, which may ensure buildup over time is limited or prevented.

In order to maintain sufficient access for cleaning effluents, the present technology may maintain a gap 440 between the chamber components. The gap 440 may refer to a location between a backside or outer annular surface of the inner isolator 420 and a lower portion of the conductive ring 430, which may extend to a lower surface that may contact or seat on the chamber body 405. Additionally, the gap 440 may refer to a space maintained between any surface of the inner isolator 420 and any surface of the liner 435. Inner isolator 420 may extend vertically beyond or through a plane formed across a surface of chamber body 405 on which conductive ring 430 may be seated. However, the gap spacing may still be maintained between any of these components and may be maintained at greater than or about 20 mils, greater than or about 25 mils, greater than or about 30 mils, greater than or about 35 mils, greater than or about 40 mils, greater than or about 45 mils, greater than or about 50 mils, greater than or about 55 mils, greater than or about 60 mils, greater than or about 65 mils, greater than or about 70 mils, greater than or about 75 mils, greater than or about 80 mils, greater than or about 85 mils, greater than or about 90 mils, greater than or about 95 mils, greater than or about 100 mils, or greater. By increasing a gap size between components along the processing region of the chamber and performing cleaning operations according to embodiments of the present technology, despite that particle accumulation may increase during deposition operations, cleaning operations may readily remove this buildup to limit or prevent accumulation over time.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the liner" includes reference to one or more liners and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
forming a plasma of a cleaning precursor in a remote region of a semiconductor processing chamber;
flowing plasma effluents of the cleaning precursor into a processing region of the semiconductor processing chamber, wherein the processing region is defined by an inner isolator extending radially about the processing region, and wherein the semiconductor processing chamber comprises:
a body;
a conductive ring seated on the body of the semiconductor processing chamber; and
an outer isolator seated atop the conductive ring, wherein the inner isolator is seated within a recessed ledge formed at an inner edge of the outer isolator;
contacting a substrate support with the plasma effluents for a first period of time;
lowering the substrate support from a first position to a second position while continuing to flow plasma effluents of the cleaning precursor; and
cleaning the processing region of the semiconductor processing chamber for a second period of time.

2. The semiconductor processing method of claim 1, wherein the cleaning precursor comprises a halogen-containing precursor.

3. The semiconductor processing method of claim 1, wherein the second period of time is longer than the first period of time.

4. The semiconductor processing method of claim 1, wherein at the first position the substrate support is a distance from a faceplate of less than or about 20 mm.

5. The semiconductor processing method of claim 4, wherein at the second position the substrate support is a distance from a faceplate of greater than or about 30 mm.

6. The semiconductor processing method of claim 1, wherein a plasma power is maintained at greater than or about 1000 W to generate plasma effluents of the cleaning precursor.

7. The semiconductor processing method of claim 1, wherein the processing region is defined by a faceplate and the substrate support.

8. The semiconductor processing method of claim 1, wherein a liner extends along the body of the semiconductor processing chamber towards the inner isolator and the conductive ring.

9. The semiconductor processing method of claim 8, wherein a gap of greater than or about 20 mils is maintained between the inner isolator and the conductive ring proximate a surface of the conductive ring seated on the body of the semiconductor processing chamber.

10. A semiconductor processing method comprising:
flowing plasma effluents of a cleaning precursor into a processing region of a semiconductor processing chamber, wherein the processing region is defined by an inner isolator extending radially about the processing region, and wherein the semiconductor processing chamber comprises:
a body;
a conductive ring seated on the body of the semiconductor processing chamber; and
an outer isolator seated atop the conductive ring, wherein the inner isolator is seated within a recessed ledge formed at an inner edge of the outer isolator;
contacting a substrate support with the plasma effluents for a first period of time;
lowering the substrate support from a first position to a second position while continuing to flow plasma effluents of the cleaning precursor; and
cleaning the processing region of the semiconductor processing chamber for a second period of time at least 20% longer than the first period of time.

11. The semiconductor processing method of claim 10, wherein a plasma power is maintained at greater than or about 1000 W to generate plasma effluents of the cleaning precursor.

12. The semiconductor processing method of claim 10, wherein the first period of time is less than or about 40% of a total cleaning time.

13. The semiconductor processing method of claim 10, wherein at the first position the substrate support is a distance from a faceplate of less than or about 20 mm, and wherein at the second position the substrate support is a distance from a faceplate of greater than or about 30 mm.

14. The semiconductor processing method of claim 10, wherein a gap of greater than or about 50 mils is maintained between the inner isolator and the conductive ring proximate a surface of the conductive ring seated on the body of the semiconductor processing chamber.

15. The semiconductor processing method of claim 14, further comprising:
flowing the plasma effluents of the cleaning precursor into the gap during the second period of time.

16. The semiconductor processing method of claim 7, wherein the faceplate is seated atop one or both of the inner isolator and the outer isolator.

17. The semiconductor processing method of claim 1, wherein top surfaces of the inner isolator and the outer isolator are coplanar.

* * * * *